United States Patent
Sonderman et al.

(10) Patent No.: US 6,751,518 B1
(45) Date of Patent: Jun. 15, 2004

(54) DYNAMIC PROCESS STATE ADJUSTMENT OF A PROCESSING TOOL TO REDUCE NON-UNIFORMITY

(75) Inventors: Thomas J. Sonderman, Austin, TX (US); Alexander J. Pasadyn, Austin, TX (US); Christopher A. Bode, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 144 days.

(21) Appl. No.: 10/134,244

(22) Filed: Apr. 29, 2002

(51) Int. Cl.[7] .............................. G06F 19/00
(52) U.S. Cl. ..................... 700/121; 700/110
(58) Field of Search ................. 700/45, 109, 110, 700/121

(56) References Cited

U.S. PATENT DOCUMENTS

| | | | | |
|---|---|---|---|---|
| 5,886,896 A | * | 3/1999 | Lantz et al. | 700/116 |
| 6,240,330 B1 | * | 5/2001 | Kurtzberg et al. | 700/121 |
| 6,392,434 B1 | * | 5/2002 | Chiu | 324/765 |
| 6,507,800 B1 | * | 1/2003 | Sheu | 702/117 |
| 6,587,744 B1 | * | 7/2003 | Stoddard et al. | 700/121 |
| 6,625,497 B2 | * | 9/2003 | Fairbairn et al. | 700/1 |
| 6,643,017 B2 | * | 11/2003 | Cohen et al. | 356/328 |

* cited by examiner

*Primary Examiner*—Albert W. Paladini
*Assistant Examiner*—Elliot Frank
(74) *Attorney, Agent, or Firm*—Williams, Morgan & Amerson, P.C.

(57) ABSTRACT

A method and an apparatus for reducing process non-uniformity across a processed semiconductor wafers. A first semiconductor wafer is processed. A process non-uniformity associated with the first processed semiconductor wafer is identified. A feedback correction in response to the process non-uniformity during processing of a second semiconductor wafer is performed and/or a feed-forward compensation is performed in response to the process non-uniformity during a subsequent process performed across the first semiconductor wafer is performed.

34 Claims, 8 Drawing Sheets

DYNAMIC PROCESS STATE ADJUSTMENT OF A PROCESSING TOOL TO REDUCE NON-UNIFORMITY

BACKGROUND OF THE INVENTION

1. Field of the Invention

This invention relates generally to semiconductor manufacturing, and, more particularly, to a method and apparatus for reducing non-uniformity across a processed semiconductor wafer using a dynamic process adjustment in a tool.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed across a group of semiconductor wafers, sometimes referred to as a lot. For example, a process layer composed of a variety of materials may be formed across a semiconductor wafer. Thereafter, a patterned layer of photoresist may be formed across the process layer using known photolithography techniques. Typically, an etch process is then performed across the process layer using the patterned layer of photoresist as a mask. This etching process results in the formation of various features or objects in the process layer. Such features may be used for a gate electrode structure for transistors. Many times, trench isolation structures are also formed across the substrate of the semiconductor wafer to isolate electrical areas across a semiconductor wafer. One example of an isolation structure that can be used is a shallow trench isolation (STI) structure. Typically, forming trenches across the semiconductor wafer and filling such trenches with an insulating material, such as silicon dioxide, form STI structures across the semiconductor wafers.

The manufacturing tools within a semiconductor manufacturing facility typically communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control script, which can be a software program that automatically retrieves the data needed to execute a manufacturing process.

FIG. 1 illustrates a typical semiconductor wafer 105. The semiconductor wafer 105 typically includes a plurality of individual semiconductor die 103 arranged in a grid 150. Using known photolithography processes and equipment, a patterned layer of photoresist may be formed across one or more process layers that are to be patterned. As part of the photolithography process, an exposure process is typically performed by a stepper on approximately one to four die 103 locations at a time, depending on the specific photomask employed. The patterned photoresist layer can be used as a mask during etching processes, wet or dry, performed across the underlying layer or layers of material, e.g., a layer of polysilicon, metal or insulating material, to transfer the desired pattern to the underlying layer. The patterned layer of photoresist is comprised of a plurality of features, e.g., line-type features or opening-type features that are to be replicated in an underlying process layer.

Turning now to FIG. 2, a flow chart illustration of a prior art process flow is illustrated. A manufacturing system processes a lot/batch of semiconductor wafers 105 (block 210). The manufacturing system then generally acquires metrology data relating to the processed semiconductor wafers 105 (block 220). The manufacturing system may also acquire sensor data, such as pressure sensor data, temperature sensor data, humidity sensor data, gas flow rate sensor data, and the like. Generally, the manufacturing system then analyzes the metrology data and/or the sensor data to determine whether there are appreciable errors across the processed semiconductor wafers 105 (block 230).

The manufacturing system may then perform feedback and/or feed-forward corrections on processes performed across the semiconductor wafers 105 based upon the analysis of the metrology/sensor data (block 240). One of the problems associated with the current processing system is the production of non-uniformly processed semiconductor wafers, which may be due to processes performed across the semiconductor wafers 105 (hereinafter referred to as "process non-uniformity"). In other words, results from processing may not be uniform across the entire semiconductor wafer 105, which is a condition that may not be detected by simply analyzing the metrology/sensor data as described above. For example, a chemical mechanical polishing (CMP) tool may polish the center of a semiconductor wafer 105 at a different speed than the outer portion of a semiconductor wafer 105. This may result in non-uniform polishing across the processed semiconductor wafer 105. In other cases, a gradient effect may occur across a semiconductor wafer 105, wherein one portion of the semiconductor wafer 105 may be processed differently from another portion. For example, during an etch process, the left half of a semiconductor wafer 105 may be etched at a faster rate than the right half of the semiconductor wafer 105, resulting in non-uniform etching across the semiconductor wafer 105.

Non-uniformity across processed semiconductor wafers 105 may result in improper correction of errors detected across the processed semiconductor wafer 105. Furthermore, devices produced from the processed semiconductor wafer 105 may be of varying qualities, wherein devices produced from the inner portion of the semiconductor wafers 105 may be of inferior quality as compared to devices produced from the outer sections of a processed semiconductor wafer 105, or vice versa. Additionally, performance of devices manufactured from one portion of the non-uniform semiconductor wafers 105 may significantly vary from the performance of devices manufactured from another portion of the semiconductor wafers 105. Furthermore, prediction of yield and/or other manufacturing planning may be adversely affected due to non-uniform areas that may exist across the processed semiconductor wafers 105.

The present invention is directed to overcoming, or at least reducing, the effects of, one or more of the problems set forth above.

SUMMARY OF THE INVENTION

In one aspect of the present invention, a method is provided for reducing process non-uniformity across a processed semiconductor wafers. A first semiconductor wafer is processed. A process non-uniformity associated with the first processed semiconductor wafer is identified. A feedback correction in response to the process non-uniformity during processing of a second semiconductor wafer is performed and/or a feed-forward compensation is performed in response to the process non-uniformity during a subsequent process performed across the first semiconductor wafer is performed.

In another aspect of the present invention, a system is provided for reducing process non-uniformity across a processed semiconductor wafers. The system of the present invention comprises: a process controller adapted to control processing of a first processed semiconductor wafer; a uniformity detection unit operatively coupled to the process controller, the uniformity detection unit being adapted to determine an area of non-uniformity across the first processed semiconductor wafer; and a feedback non-uniformity correction unit operatively coupled to the uniformity detection unit and to the process controller, the feedback non-uniformity correction unit being adapted to modify a process variable relating to the area of process non-uniformity during processing of a second semiconductor wafer.

In yet another aspect of the present invention, a computer readable program storage device encoded with instructions is provided for reducing process non-uniformity across semiconductor wafers. The computer readable program storage device encoded with instructions when executed by a computer: processes a first semiconductor wafer; identifies a process non-uniformity associated with the first processed semiconductor wafer; and performs a feedback correction in response to the process non-uniformity during processing of a second semiconductor wafer, and/or a feed-forward compensation in response to the process non-uniformity during a subsequent process performed across the first processed semiconductor wafer.

BRIEF DESCRIPTION OF THE DRAWINGS

The invention may be understood by reference to the following description taken in conjunction with the accompanying drawings, in which like reference numerals identify like elements, and in which.

Figure 1:
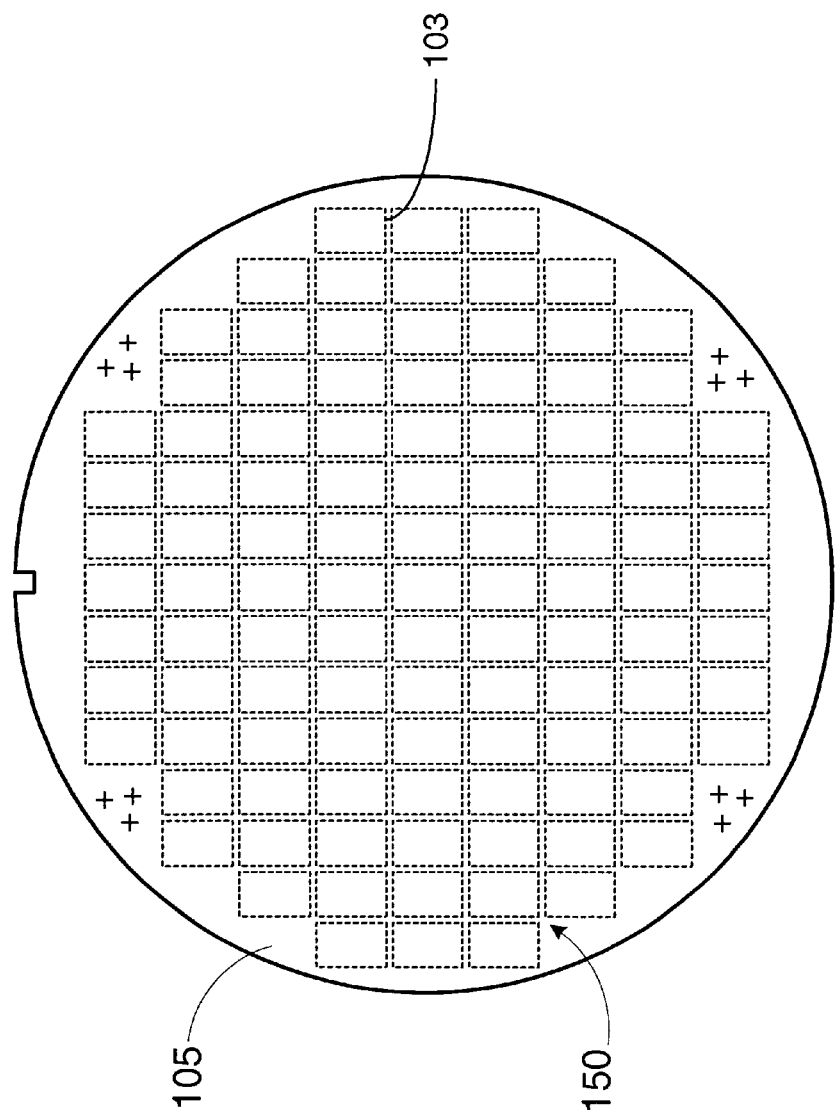
FIG. 1 is a simplified diagram of a prior art semiconductor wafer being processed.
Figure 2:
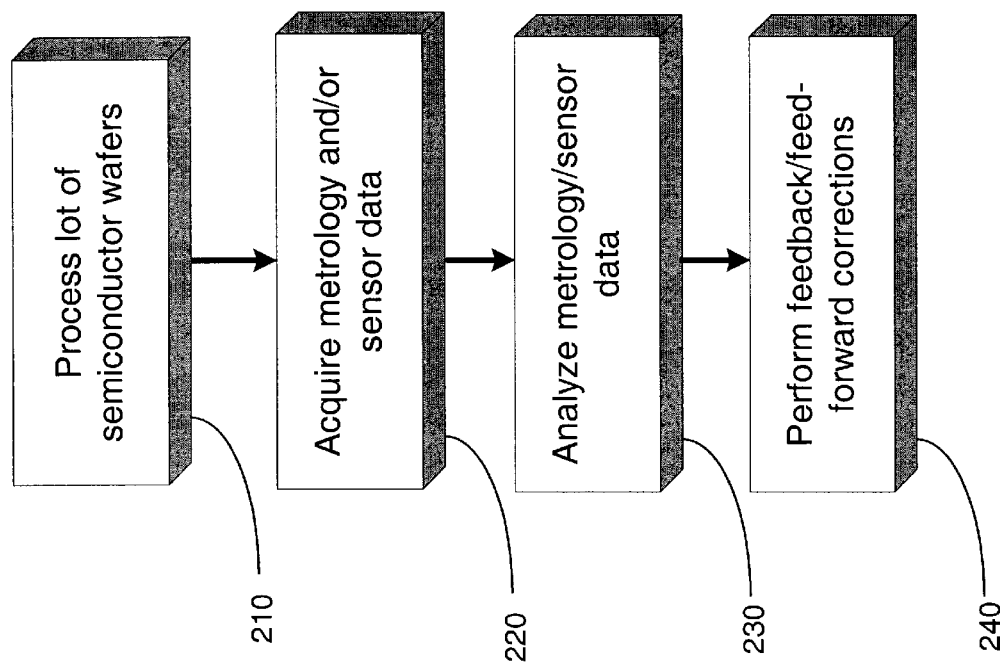
FIG. 2 illustrates a simplified flowchart depiction of a prior art process flow during manufacturing of semiconductor wafers.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. Often, detecting and/or reducing process non-uniformity that may be present across processed semiconductor wafers 105 may be useful in producing devices having improved and predictable quality. Embodiments of the present invention provide for reducing non-uniformity of processed semiconductor wafers 105. Non-uniformity across the processed semiconductor wafers 105 may result from a variety of factors such as initial semiconductor wafer effects (e.g., first-wafer effects). Embodiments of the present invention provide for detecting non-uniform processed sections across semiconductor wafers 105 and provide a feedback correction and/or a feed-forward compensation. Embodiments of the present invention provide for performing a feedback correction of subsequently processed semiconductor wafers 105 based on manipulating one or more process variables to reduce process non-uniformity. Embodiments of the present invention also provide for adjusting/manipulating process variables to compensate for process non-uniformity discovered across previously processed semiconductor wafers 105.

Figure 3:
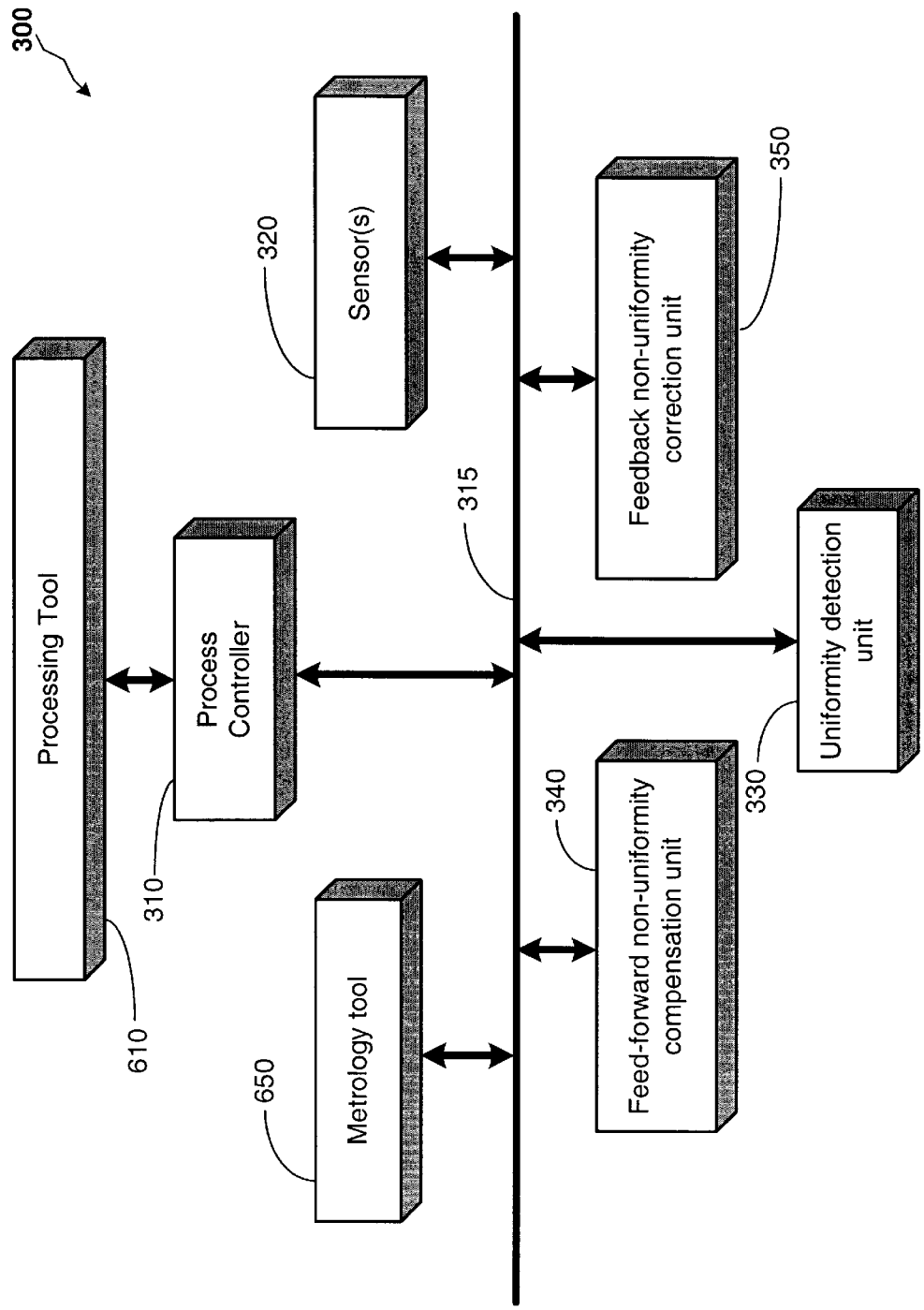
FIG. 3 is a block diagram representation of a system in accordance with one illustrative embodiment of the present invention.

Turning now to FIG. 3, a block diagram illustrating a system 300, in accordance with embodiments of the present invention, is illustrated. The system 300 comprises a processing tool 610 that is generally controlled by a process controller 310. In one embodiment, the process controller 310 may comprise an APC framework. The system 300 also comprises a metrology tool 650 capable of acquiring metrology data regarding processed semiconductor wafers 105 that have been processed by the processing tool 610. The system 300 also comprises one or more sensors 320 that acquire sensor data relating to the process performed on the semiconductor wafers 105. The sensors 320 are generally associated with particular processing tools 610. The sensors 320 may include a temperature sensor, a pressure sensor, a humidity sensor, a gas flow rate sensor, and the like.

The system 300 also comprises a uniformity detection unit 330, a feed-forward non-uniformity compensation unit 340, and a feedback non-uniformity correction unit 350, which communicate with the processing tool 610, the metrology tool 650, the sensors 320, and the process controller 310 via a communication link and/or a network connection 315. The system communications line 315 may be a computer bus link, a dedicated hardware communications link, a telephone system communications link, a wireless communications link, or other communication links that may be implemented by those skilled in the art having benefit of the present disclosure. In one embodiment, the uniformity detection unit 330, the feed-forward non-uniformity compensation unit 340, and the feedback non-uniformity correction unit 350 may be hardware, software, and/or firmware components that may be standalone units or may be integrated into a computer system associated with the system 300.

The uniformity detection unit 330 is capable of detecting whether the semiconductor wafer 105 that is processed has a substantially uniform result from the processing. In one embodiment, the uniformity across a processed semiconductor wafer 105 may be determined by comparing target process uniformity to the analyzed metrology/manufacturing environment data to determine whether the uniformity across the semiconductor wafer 105 is within a predetermined range of values. The uniformity detection unit 330 is capable of analyzing the metrology and sensor data, and relating particular sensor data to the metrology data to determine a relationship between particular sensor data and particular process errors/non-uniformity discovered across the processed semiconductor wafer 105. The uniformity detection unit 330 is capable of detecting areas across the processed semiconductor wafer 105 that contain unacceptable non-uniform production features. The process non-uniformity across the processed semiconductor wafer 105 may be a result of the current process and/or the result of an upstream process.

Based upon process the process non-uniformity data provided by the uniformity detection unit 330, the feed-forward non-uniformity compensation unit 340 may perform one or more modifications to subsequent process steps in order to compensate for process non-uniformity discovered across the processed semiconductor wafers 105. The feed-forward non-uniformity compensation unit 340 may identify one or more compensation processes for correcting a process non-uniformity detected by the uniformity detection unit 330. The compensation process may be implemented by modifying a control input parameter relating to a subsequent process step performed on the processed semiconductor wafer 105, in order to compensate for the across-wafer process non-uniformity. That is, the system 300 may induce process non-uniformity in a subsequent process (i.e., feed-forward compensation) to compensate for the process non-uniformity resulting from a previous process. For example, if during a process performed by a deposition tool, non-uniform film is deposited across a semiconductor wafer 105 (e.g., center of the wafer being thick and the edge being thin), the system 300 may induce a non-uniformity in a subsequent polish process (e.g., CMP process) to compensate for the original process. Using this methodology, the non-uniformity resulting from the original deposition process may be compensated for by the induced non-uniformity in the subsequent polishing process. The inducement of non-uniformity in the subsequent polishing process may be performed by adjusting/manipulating a process variable (e.g., pad rotational speed, polishing arm down-force, rotational speed of the polishing lead, oscillation length, and the like. For other non-uniformities caused by other processes, a plurality of other process variables may be adjusted, such as a temperature variable, a gas flow rate variable, a pressure variable, an electric current variable, and the like. Other feed-forward process non-uniformities may be induced as will be recognized by those skilled in the art having benefit of the present disclosure.

The system 300 may also provide a feedback correction to subsequent semiconductor wafers 105 processed by the same process that originally caused the process non-uniformity. The feedback non-uniformity correction unit 350 is capable of processing the process non-uniformity data provided by the uniformity detection unit 330 and determining a feedback correction for the process based upon the detected process non-uniformity. The feedback non-uniformity correction unit 350 may manipulate/adjust process variables to reduce the possibility of process non-uniformity across subsequently processed semiconductor wafers 105. The feedback non-uniformity correction unit 350 may also adjust process recipes and/or make other changes known by those skilled in the art having the benefit of the present disclosure. A more detailed description of the feed-forward/feedback adjustments in response to process non-uniformity across processed semiconductor wafers 105 is provided below.

Figure 4:
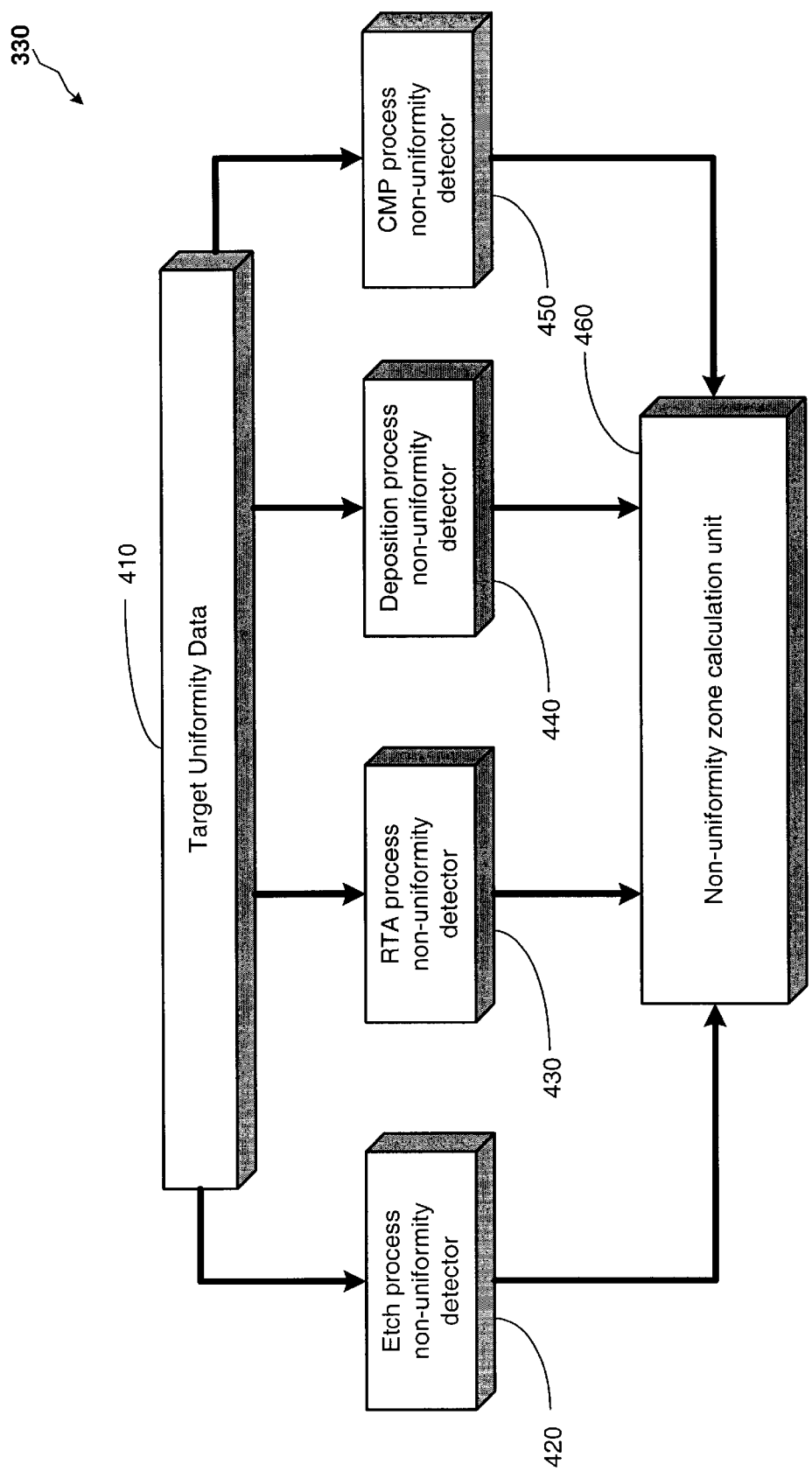
FIG. 4 is a more detailed block diagram representation of a uniformity detection unit of FIG. 3, in accordance with one illustrative embodiment of the present invention.

Turning now to FIG. 4, a block diagram representation of the uniformity detection unit 330 is illustrated. In one embodiment, the uniformity detection unit 330 may comprise an etch process non-uniformity detector 420, an Rapid Thermal Annealing (RTA) process non-uniformity detector 430, a deposition process non-uniformity detector 440, a CMP process non-uniformity detector 450, and/or other non-uniformity detectors for various other processes performed across the processed semiconductor wafers 105. The non-uniformity detectors 420, 430, 440, 450 receive target process uniformity data 410 to compare with data collected regarding one or more characteristics of the feature or structures formed across the semiconductor wafers 105. A non-uniformity zone calculation unit 460 is capable of identifying zones across a processed semiconductor wafer 105 that may contain areas that are non-uniform (hereinafter referred to as "zones"), which relate to an etch process, a RTA process, a deposition process, a CMP process, or other processes performed across the semiconductor wafer 105. Depending on the particular process that is being analyzed, the non-uniformity zone calculation unit 460 identifies various types of zones across the processed semiconductor wafers 105 that may contain non-uniform features or processing characteristics.

Figures 5A, 5B:
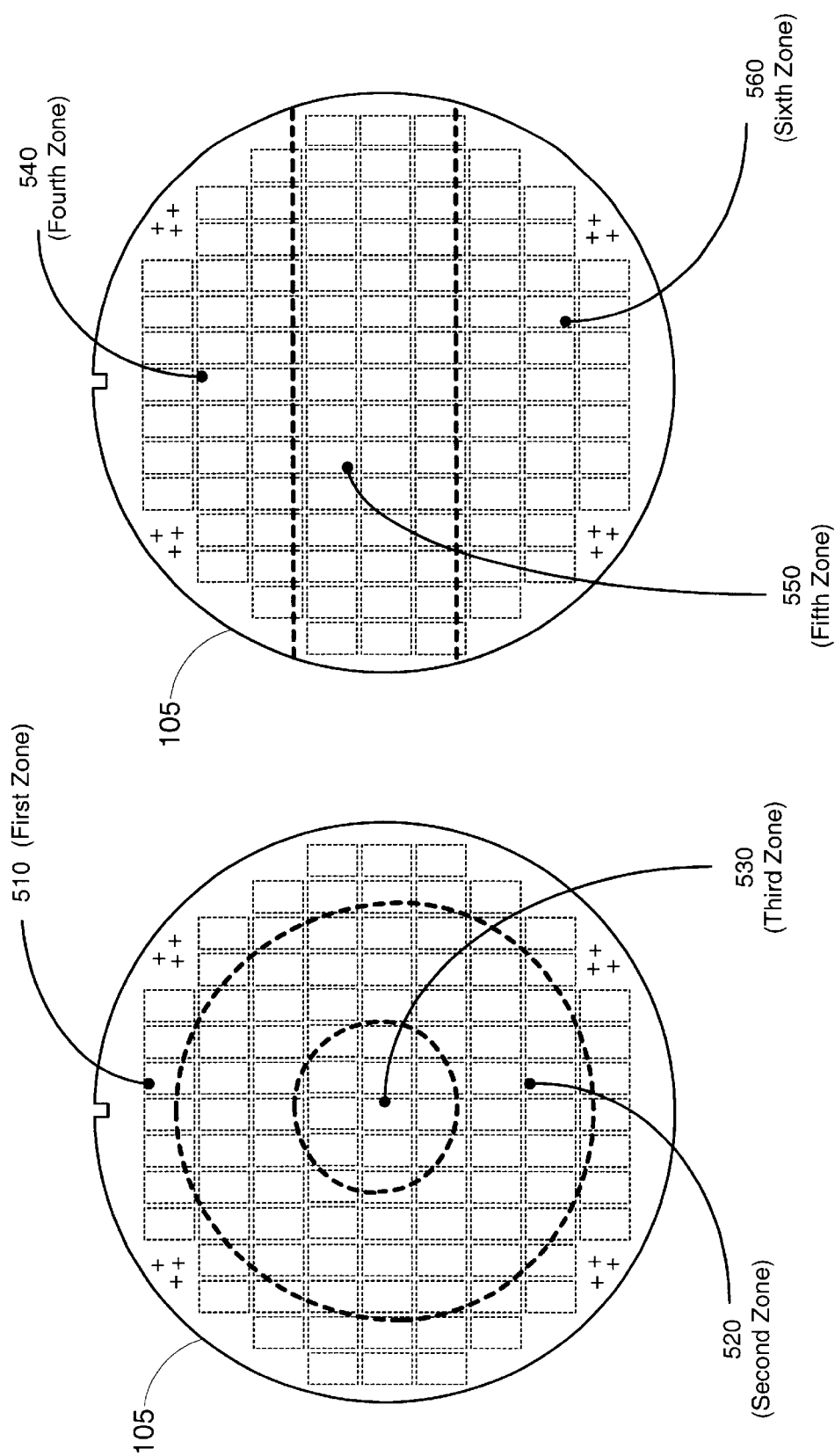
FIG. 5a illustrates a diagram of a semiconductor wafer partitioned in concentric zones for process non-uniformity analysis.
FIG. 5b illustrates a diagram of a semiconductor wafer partitioned in longitudinal zones for process non-uniformity analysis.

Turning now to FIG. 5A, examples of zones that contain non-uniform features or characteristics across the processed semiconductor wafer (hereinafter referred to as "zones"), which are determined by the non-uniformity zone calculation unit 460 are illustrated. As shown in FIG. 5A, a concentric set of zones is depicted (e.g., a first zone 510, a second zone 520, and a third zone 530) to illustrate different zones for a particular process, such as a polishing process. For example, a CMP process may be performed at a different rate across the third zone as compared to the polishing performed across the first zone. Similarly, for a deposition process, a different type of zone may be defined (e.g., a fourth zone 540, a fifth zone 550, and a sixth zone 560). During a deposition process, as illustrated in FIG. 5B, the deposition may vary between the fifth zone and the sixth zone thereby causing process non-uniformity across the processed semiconductor wafer 105.

Based upon the zones 510–560 defined by the uniformity detection unit 330, appropriate feed-forward and/or feedback corrective actions may be implemented to those zones 510–560 identified. For example, during an etch process, particular zones 510–560 may be identified in a concentric zone format as illustrated in FIG. 5A. The temperature during the etch processing may be adjusted across the first, second, and third zones 510, 520, 530 independently such that more uniform etching of the semiconductor wafer 105 may take place. Generally, during the etch process, when the temperature of a particular zone 510–560 is increased, that particular zone 510–560 may experience faster etching rates.

For RTA processes performed on the semiconductor wafers 105, the different zones of temperature may be longitudinal as shown in FIG. 5B. The fourth, fifth and sixth zones 540, 550, 560 may be independently adjusted wherein different temperature is applied across different zones by adjusting the controls of a series of lamps, which may be located within the processing tool 610, used to perform the RTA process. By adjusting the temperature of different zones during the RTA process, semiconductor wafers 105 with more uniform results may be manufactured.

For deposition processes performed on the semiconductor wafers 105, adjustments may be made to reduce the non-uniformity across the processed semiconductor wafer 105 by adjusting a parameter that controls the pressure experienced by the semiconductor wafer 105 during deposition processes. Generally, the zones that have non-uniformity of deposition processes are longitudinal in nature, as indicated in FIG. 5B. Therefore, adjusting the pressure across the longitudinal zones 540, 550, 560 may result in more uniform film thickness.

For polishing processes performed on the semiconductor wafers 105, concentric zones are generally defined, as illustrated in FIG. 5A. For example, polishing across the third zone 530 may produce a different result as compared to the results from polishing across the first zone 510, causing a non-uniform polishing result. Generally, a parameter that controls the pressure experienced across the semiconductor wafers 105 during the polishing process may be adjusted in one or more particular concentric zone 510, 520, 530 to reduce non-uniform polishing of processed semiconductor wafers 105. Similarly, other process variables, such as gas flow rate, humidity, and the like, may be adjusted to overcome process non-uniformity for a variety of process steps performed across the semiconductor wafer 105.

Figure 6:
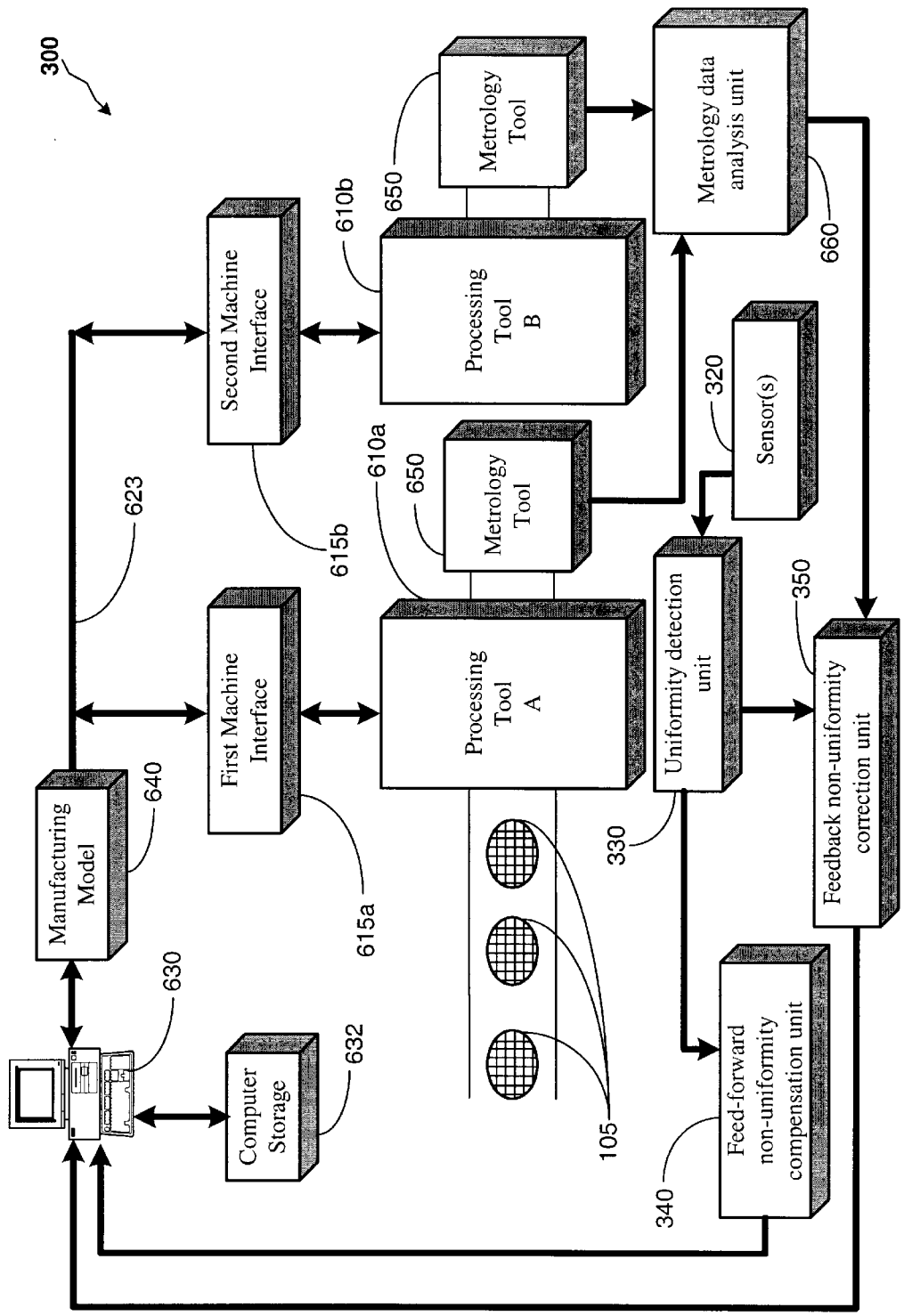
FIG. 6 illustrates a more detailed block diagram representation of the system shown in FIG. 3, in accordance with one illustrative embodiment of the present invention.

Turning now to FIG. 6, a more detailed block diagram of the system 300 in accordance with one embodiment of the present invention is illustrated. Semiconductor wafers 105 are processed on processing tools 610*a*, 610*b* using a plurality of control input signals, or manufacturing parameters, provided via a line or network 623. The control input signals, or manufacturing parameters, on the line 623 are sent to the processing tools 610*a*, 610*b* from a computer system 630 via machine interfaces 615*a*, 615*b*. The first and second machine interfaces 615*a*, 615*b* are generally located outside the processing tools 610*a*, 610*b*. In an alternative embodiment, the first and second machine interfaces 615*a*, 615*b* are located within the processing tools 610*a*, 610*b*. The semiconductor wafers 105 are provided to and carried from a plurality of processing tools 610. In one embodiment, semiconductor wafers 105 may be provided to a processing tool 610 manually. In an alternative embodiment, semiconductor wafers 105 may be provided to a processing tool 610 in an automatic fashion (e.g., robotic movement of semiconductor wafer 105). In one embodiment, a plurality of semiconductor wafers 105 is transported in lots (e.g., stacked in cassettes) to the processing tools 610.

In one embodiment, the computer system 630 sends control input signals, or manufacturing parameters, on the line 623 to the first and second machine interfaces 615*a*, 615*b*. The computer system 630 is capable of controlling processing operations. In one embodiment, the computer system 630 is a process controller. The computer system 630 is coupled to a computer storage unit 632 that may contain a plurality of software programs and data sets. The computer system 630 may contain one or more processors (not shown) that are capable of performing the operations described herein. The computer system 630 employs a manufacturing model 640 to generate control input signals on the line 623. In one embodiment, the manufacturing model 640 contains a manufacturing recipe that determines a plurality of control input parameters that are sent on the line 623 to the processing tools 610*a*, 610*b*.

In one embodiment, the manufacturing model 640 defines a process script and input control that implement a particular manufacturing process. The control input signals (or control input parameters) on the line 623 that are intended for processing tool A 610*a* are received and processed by the first machine interface 615*a*. The control input signals on the line 623 that are intended for processing tool B 610*b* are received and processed by the second machine interface 615*b*. Examples of the processing tools 610*a*, 610*b* used in semiconductor manufacturing processes are steppers, etch process tools, deposition tools, and the like.

One or more of the semiconductor wafers 105 that are processed by the processing tools 610*a*, 610*b* can also be sent to a metrology tool 650 for acquisition of metrology data. The metrology tool 650 may be a scatterometry data acquisition tool, an overlay-error measurement tool, a critical dimension measurement tool, and the like. In one embodiment, a metrology tool 650 examines one or more processed semiconductor wafers 105. The metrology data analysis unit 660 may collect, organize, and analyze data from the metrology tool 650. The metrology data is directed to a variety of physical or electrical characteristics of the devices formed across the semiconductor wafers 105. For example, metrology data may be obtained as to line width measurements, depth of trenches, sidewall angles, thickness, resistance, and the like. Metrology data may be used to determine the process uniformity across processed semiconductor wafers 105.

The metrology data from a metrology data analysis unit 660 and the sensor data from the sensors 320 is sent to the uniformity detection unit 330 that provides data to the feedback non-uniformity correction unit 350 and the feed-forward non-uniformity compensation unit 340. The feedback and feed-forward units 340, 350 then send feed-forward and feedback compensation/correction data to the computer system 630, which performs appropriate corrections to the operation of the processing tools 610.

Figure 7:
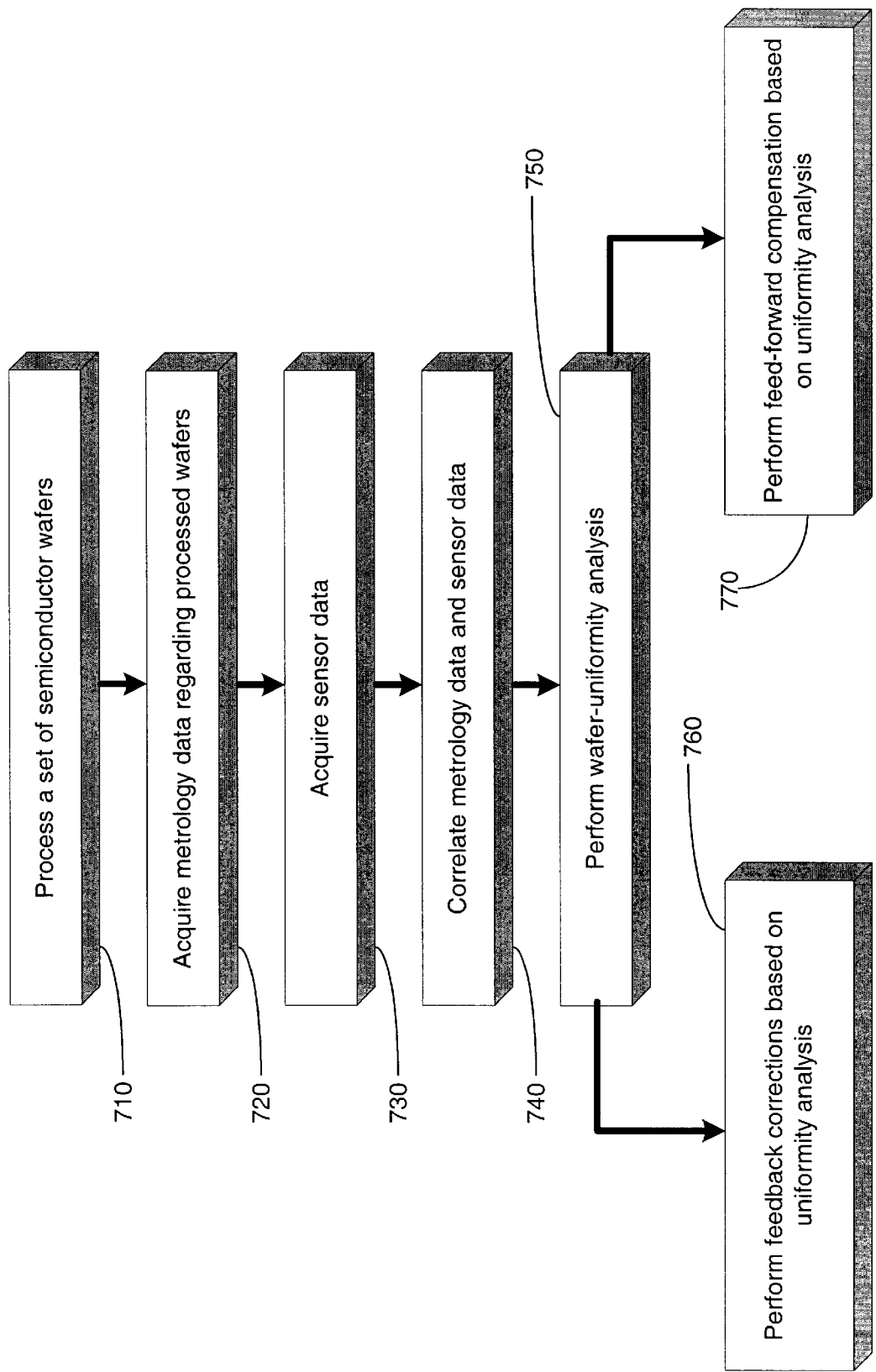
FIG. 7 illustrates a flowchart depiction of a method in accordance with one illustrative embodiment of the present invention.

Turning now to FIG. 7, a flow chart depiction of the methods, in accordance with embodiments of the present invention, is illustrated. The system 300 processes a set of semiconductor wafers 105 (block 710). The process performed across the semiconductor wafers 105 may be, but are not limited to, an etch process, a CMP process, a photolithography process, an RTA process, and the like. Upon processing of semiconductor wafers 105, the system 300 may acquire metrology data regarding the processed semiconductor wafers 105 (block 720). Metrology tools 650 associated with the system 300 generally acquire the metrology data. In one embodiment, an inline metrology tool acquires metrology data. In another embodiment, an offline metrology tool acquires metrology data. In an alternative embodiment, a metrology tool 650 that is integrated into the processing tools 610 may acquire the metrology data. The system 300 also acquires sensor data 730. The sensor data may include the temperature data, the gas flow rate data, the humidity data, the pressure data, and the like.

The system 300 may then correlate the metrology data and the sensor data (e.g., manufacturing environment data, such as temperature, humidity, gas flow rate, pressure data) to relate to particular sensor data to errors discovered across the semiconductor wafers 105 (block 740). The system 300 then generally performs a semiconductor wafer uniformity analysis to identify areas of non-uniformity across the processed semiconductor wafer 105 (block 750). A more detailed description of the semiconductor wafer uniformity analysis, indicated in block 750, is provided in FIG. 8 and accompanying description below. Upon performing the semiconductor wafer uniformity analysis process, non-uniformity data is made available to the system 300. The non-uniformity data may include zones (as illustrated in FIGS. 5a and 5b) across the processed semiconductor wafers 105 that are non-uniform (e.g., concentric zones, longitudinal zones, or other geometric zones of the processed semiconductor wafers 105).

The system 300 may then perform a feedback correction based on the uniformity analysis (block 760). The feedback corrections may include adjusting or manipulating one or more process variables to influence the operation of a processing tool 610 on subsequently processed semiconductor wafers 105. The system 300 may also perform a feed-forward compensation process based on the process uniformity analysis (block 770). The feed-forward compensation process includes determining zones on the semiconductor wafers 105 that contain non-uniform features or processing characteristics and/or inducing another non-uniformity on the semiconductor wafer 105 during a subsequent process performed on the semiconductor wafer 105. This may reduce the effect(s) of the original processing non-uniformity on the semiconductor wafers 105. The feed-forward compensation process includes, in one embodiment, reducing the process non-uniformity discovered in the deposition process by adjusting the pressure in a non-uniform manner during a polishing process performed on the semiconductor wafers 105. This may reduce the effect of the original process non-uniformity that occurred as a result of the deposition process performed on the processed semiconductor wafer 105, thereby producing a more uniformly processed semiconductor wafer 105.

By implementing the feed-forward and feedback corrections described by embodiments of the present invention, a more uniformly processed semiconductor wafer 105 may result. Therefore, devices produced from the corrected semiconductor wafers 105 may result in devices that are more uniform in terms of quality and performance. This may allow for higher yields and more efficient and effective planning of manufacturing devices from semiconductor wafers 105.

Figure 8:
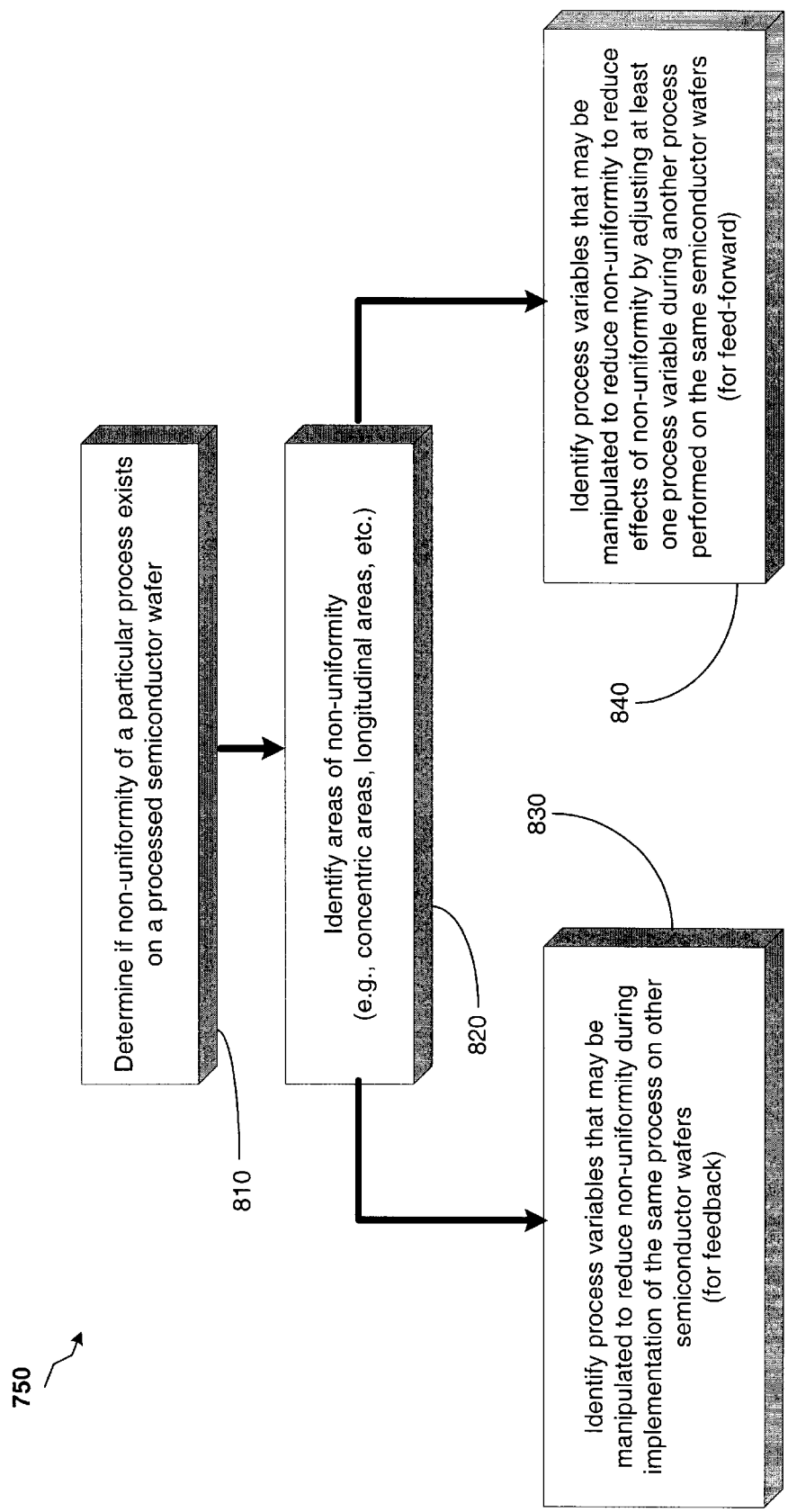
FIG. 8 illustrates a flowchart depiction of a method of performing a semiconductor wafer process uniformity analysis, as indicated in FIG. 7, in accordance with one illustrative embodiment of the present invention.

Turning now to FIG. 8, a more detailed flow chart depiction of the step of performing the processed semiconductor wafer process uniformity analysis indicated in block 750 is illustrated. The system 300 determines if non-uniformity of a particular process exists across processed semiconductor wafers 105 (block 810). In one embodiment, the uniformity detection unit 330 analyzes the metrology and/or sensor data and their correlation, to identify areas of process non-uniformity that create areas of non-uniformity across the processed semiconductor wafers 105. The system 300 then identifies areas of process non-uniformity (e.g., concentric areas, longitudinal areas, etc.) to better correct the areas of process non-uniformity (block 820).

The system 300 then identifies process variables that may be manipulated/adjusted to reduce process non-uniformity during the implementation of the same process performed on subsequent semiconductor wafers 105 (block 830). For example, the system 300 may determine that parameters controlling the pressure variable and a temperature variable may be adjusted in particular zones of the processed semiconductor wafers 105 to produce a more uniform processed semiconductor wafer 105. The system 300 also identifies process variables that may be manipulated to reduce process non-uniformity and its affects on another process performed on the processed semiconductor wafer 105 containing the process non-uniformity (block 840). These process variables may be adjusted in particular areas/zones of the semiconductor wafer 105 to cause or induce process non-uniformity in those areas, which may lead to a reduction of the overall non-uniformity existing across the semiconductor wafer 105. The completion of the steps illustrated in FIG. 8 substantially completes the steps of the processed semiconductor wafer uniformity analysis indicated in block 750 of FIG. 7.

Utilizing the steps of the semiconductor wafer uniformity analysis provided by embodiments of the present invention, processed semiconductor wafers 105 that are more uniform may be manufactured. Therefore, devices manufactured from the corrected semiconductor wafers 105 may contain more uniform quality and/or performance characteristics.

The principles taught by the present invention can be implemented in an Advanced Process Control (APC) Framework, such as a Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI. The APC is a preferred platform from which to implement the control strategy taught by the present invention. In some embodiments, the APC can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   processing a first semiconductor wafer;
   acquiring metrology data relating to the processed first semiconductor wafer;
   acquiring sensor data relating to said processing of said first semiconductor wafer;
   correlating said metrology data with said sensor data;
   identifying a process non-uniformity associated with said first processed semiconductor wafer based upon said correlating of said metrology data with said sensor data; and
   performing at least one of a feedback correction in response to said process non-uniformity during processing of a second semiconductor wafer, and a feed-forward compensation in response to said process non-uniformity during a subsequent process performed across said first semiconductor wafer.

2. The method of claim 1, further comprising acquiring sensor data relating to said processing of said first semiconductor wafer.

3. The method of claim 2, wherein identifying a process non-uniformity associated with said first processed semiconductor wafer further comprises identifying a first area on said first processed semiconductor wafer that has a process result that varies from a process result of a second area on said first processed semiconductor wafer.

4. The method of claim 3, wherein performing said feedback correction in response to said process non-uniformity further comprises modifying a process variable relating to at least one of said first area and said second area across said first processed semiconductor wafer.

5. The method of claim 3, wherein identifying a process non-uniformity associated with said first processed semiconductor wafer further comprises acquiring metrology data related to said first processed semiconductor wafer and correlating said metrology data with said sensor data.

6. The method of claim 3, wherein identifying a process non-uniformity associated with said first processed semiconductor wafer further comprises identifying a first area that is concentric in relation to said second area.

7. The method of claim 3, wherein identifying a first area across said first semiconductor wafer that varies from a process result of a second area across said first processed semiconductor wafer further comprises identifying a first area that is longitudinal in relation to said second area.

8. The method of claim 3, wherein identifying a first area across said first processed semiconductor wafer that varies from a process result of a second area across said first processed semiconductor wafer further comprises identifying a first concentric area that has a different etch process result from that of a second concentric area.

9. The method of claim 8, wherein performing said feedback correction in response to said process non-uniformity further comprises applying a first temperature level to said first concentric area and a second temperature level to said second concentric area during an etch process.

10. The method of claim 3, wherein identifying a first area across said first semiconductor wafer that varies from a process result of a second area across said first processed semiconductor wafer further comprises identifying a first concentric area that has a different chemical-mechanical polishing process result from that of a second concentric area.

11. The method of claim 10, wherein performing said feedback correction in response to said process non-uniformity further comprises applying a first pressure level to said first concentric area and a second pressure level to said second concentric area during a chemical-mechanical polishing process.

12. The method of claim 3, wherein identifying a first area across said first processed semiconductor wafer that varies from a process result of a second area across said first processed semiconductor wafer further comprises identifying a first longitudinal area that has a different rapid thermal annealing process result from that of a second longitudinal area.

13. The method of claim 12, wherein performing said feedback correction in response to said process non-uniformity further comprises applying a first temperature level to said first longitudinal area and a second temperature level to said second longitudinal area during a rapid thermal annealing process.

14. The method of claim 3, wherein identifying a first area across said first processed semiconductor wafer that varies from a process result of a second area across said first processed semiconductor wafer further comprises identifying a first longitudinal area that has a different deposition process result from that of a second longitudinal area.

15. The method of claim 14, wherein performing said feedback correction in response to said process non-uniformity further comprises applying a first pressure level to said first longitudinal area and a second pressure level to said second longitudinal area during a deposition process.

16. The method of claim 1, wherein performing a feed-forward compensation in response to said process non-uniformity during a subsequent process performed across said first processed semiconductor wafer further comprises creating a non-uniformity across said first processed semiconductor wafer during said subsequent process to reduce an effect of said process non-uniformity.

17. A method, comprising:
    processing a first semiconductor wafer;
    acquiring metrology data relating to said first processed semiconductor wafer;
    acquiring sensor data relating to said processing said first semiconductor wafer;
    correlating said metrology data with said sensor data;
    determining whether an area of process non-uniformity results from said processing of said first processed semiconductor wafer based upon said correlating of said metrology data with said sensor data; and performing a feedback correction in response to said determination that said area of process non-uniformity results during processing of a second semiconductor wafer, said feedback correction comprising modifying a process variable relating to said area of process non-uniformity during processing of said second processed semiconductor wafer.

18. The method of claim 17, wherein further comprising performing a feed-forward compensation in response to said determination of said process non-uniformity during said subsequent process performed across said first processed semiconductor wafer, said feed-forward compensation comprising modifying a process variable relating to said area of non-uniformity across the first processed semiconductor wafer during said subsequent process performed across said first processed semiconductor wafer.

19. The method of claim 18, wherein determining whether said area of non-uniformity across the processed semiconductor wafer results from said processing of said first processed semiconductor wafer further comprises identifying a first area across said first processed semiconductor wafer that varies from a process result of a second area across said first processed semiconductor wafer.

20. The method of claim 19, wherein identifying a first area across said first processes semiconductor wafer that varies in a process result from a second area across said first processed semiconductor wafer further comprises identifying a first area that is concentric in relation to said second area.

21. The method of claim 20, wherein identifying a first area across said first processed semiconductor wafer that varies from a process result of a second area across said first processed semiconductor wafer further comprises identifying a first area that is longitudinal in relation to said second area.

22. An apparatus, comprising:
means for processing a first semiconductor wafer;
means for acquiring metrology data relating to the processed first semiconductor wafer;
means for acquiring sensor data relating to said processing of said first semiconductor wafer;
means for correlating said metrology data with said sensor data;
means for identifying a process non-uniformity associated with said first processed semiconductor wafer based upon said correlating of said metrology data with said sensor data; and
means for performing at least one of a feedback correction in response to said process non-uniformity during processing of a second semiconductor wafer, and a feed-forward compensation in response to said process non-uniformity during a subsequent process performed across said first processed semiconductor wafer.

23. A system, comprising:
a process controller adapted to control processing of a first processed semiconductor wafer;
a uniformity detection unit operatively coupled to said process controller, said uniformity detection unit being adapted to determine an area of non-uniformity across said first processed semiconductor wafer based upon correlating of metrology data associated with said first processed semiconductor wafer, and sensor data associated with processing of said first semiconductor wafer; and a feedback non-uniformity correction unit operatively coupled to said uniformity detection unit and to said process controller, said feedback non-uniformity correction unit being adapted to modify a process variable relating to said area of process non-uniformity during processing of a second semiconductor wafer.

24. The system of claim 23, further comprising a feed-forward compensation unit operatively coupled to said uniformity detection unit and to said process controller, said a feed-forward compensation unit being adapted to modify a process variable relating to said area of process non-uniformity during a subsequent processing of said first processed semiconductor wafer.

25. The system of claim 23, wherein said uniformity detection unit further comprises:
at least one of an etch process non-uniformity detector, a rapid thermal annealing process non-uniformity detector, a deposition process non-uniformity detector; and a chemical-mechanical polishing process non-uniformity detector; and
a non-uniformity zone calculation unit coupled with at least one of said etch process non-uniformity detector, said rapid thermal annealing process non-uniformity detector, said deposition process non-uniformity detector; and said chemical-mechanical polishing process non-uniformity detector, said non-uniformity zone calculation unit to determine a non-uniformity zone across processed semiconductor wafers.

26. The system of claim 23, further comprising:
a computer system operatively coupled with said uniformity detection unit;
a manufacturing model operatively coupled with said computer system, said manufacturing model to generate and modify at least one control input parameter signal that controls processing of said first and said second semiconductor wafer;
a machine interface operatively coupled with said manufacturing model, said machine interface being capable of receiving process recipes from said manufacturing model;
a processing tool capable of processing semiconductor wafers and operatively coupled with said machine interface, said processing tool to receive at least one control input parameter signal from said machine interface;
a metrology tool operatively coupled to said processing tool, said metrology tool to acquire metrology data to detect at least one defect across said processed semiconductor wafer; and
a sensor operatively coupled with said processing tool, said sensor being adapted to acquire a level relating to said process variable.

27. A computer readable program storage device encoded with instructions that, when executed by a computer, performs a method, comprising:
processing a first semiconductor wafer;
acquiring metrology data relating to the processed first semiconductor wafer;
acquiring sensor data relating to said processing of said first semiconductor wafer;
correlating said metrology data with said sensor data;
identifying a process non-uniformity associated with said first processed semiconductor wafer based upon said correlating of said metrology data with said sensor data; and performing at least one of a feedback correction in response to said process non-uniformity during processing of a second semiconductor wafer, and a feed-forward compensation in response to said process non-uniformity during a subsequent process performed across said first processed semiconductor wafer.

28. The computer readable program storage device encoded with instructions that, when executed by a computer, performs the method of claim 27, further comprising acquiring sensor data relating to said processing of said first processed semiconductor wafer.

29. The computer readable program storage device encoded with instructions that, when executed by a computer, performs the method of claim 28, wherein identifying a process non-uniformity associated with said first processed semiconductor wafer further comprises identifying a first area on said first processed semiconductor wafer that has a process result that varies from a process result of a second area on said first processed semiconductor wafer.

30. The computer readable program storage device encoded with instructions that, when executed by a computer, performs the method of claim 29, wherein performing said feedback correction in response to said process non-uniformity further comprises modifying a process variable relating to at least one of said first area and said second area.

31. The computer readable program storage device encoded with instructions that, when executed by a computer, performs the method of claim 29, wherein identifying a first area across said first processed semiconductor wafer that varies from a process result of a second area across said first processed semiconductor wafer further comprises acquiring metrology data related to said first processed semiconductor wafer and correlating said metrology data with said sensor data.

32. The computer readable program storage device encoded with instructions that, when executed by a computer, performs the method of claim 29, wherein identifying a first area across said first processed semiconductor wafer that varies from a process result of a second area across said first processed semiconductor wafer further comprises identifying a first area that is concentric in relation to said second area.

33. The computer readable program storage device encoded with instructions that, when executed by a computer, performs the method of claim 29, wherein identifying a first area across said first processed semiconductor wafer that varies from a process result of a second area across said first processed semiconductor wafer further comprises identifying a first area that is longitudinal in relation to said second area.

34. The computer readable program storage device encoded with instructions that, when executed by a computer, performs the method of claim 27, wherein performing a feed-forward compensation in response to said process non-uniformity during a subsequent process performed across said first processed semiconductor wafer further comprises creating a non-uniformity across said first processed semiconductor wafer during said subsequent process to reduce an effect of said process non-uniformity.

* * * * *